United States Patent
Lopez et al.

(10) Patent No.: US 6,917,225 B2
(45) Date of Patent: Jul. 12, 2005

(54) DRIVER CIRCUIT FOR DRIVING A SWITCHING TRANSISTOR

(75) Inventors: Daniel Lopez, Villingen-Schwenningen (DE); Jean-Paul Louvel, Brigachtal (DE)

(73) Assignee: Thomson Licensing S.A., Boulogne-Billancourt (FR)

(*) Notice: Subject to any disclaimer, the term of this patent is extended or adjusted under 35 U.S.C. 154(b) by 0 days.

(21) Appl. No.: 10/428,654

(22) Filed: May 2, 2003

(65) Prior Publication Data

US 2003/0206041 A1 Nov. 6, 2003

(51) Int. Cl.$^7$ ................................................ H03K 3/00
(52) U.S. Cl. ..................... 327/108; 327/436; 323/247; 323/251
(58) Field of Search ..................... 327/108–112, 434, 327/436, 437; 323/247, 251, 255, 305, 328

(56) References Cited

U.S. PATENT DOCUMENTS 4,645,956 A * 2/1987 Shuey ......................... 327/318
5,305,191 A * 4/1994 Loftus, Jr. .................... 363/17

FOREIGN PATENT DOCUMENTS

| EP | 0185481 | 6/1986 |
|---|---|---|
| EP | 0530809 A1 | 3/1993 |
| JP | 59007545 A1 | 8/1985 |

* cited by examiner

Primary Examiner—Kenneth B. Wells
(74) Attorney, Agent, or Firm—Joseph S. Tripoli; Harvey D. Fried; Sammy S. Henig

(57) ABSTRACT

The driver circuit for driving a switching transistor comprises a driver transformer for driving the switching transistor and an output stage for driving the driver transformer, and an output of the driver circuit is used for providing also said switching voltage. The switching voltage is derived advantageously from the primary winding of the driver transformer. Preferably a terminal of the primary winding of the driver transformer is directly wired to the gate electrode of the MOS transistor.

7 Claims, 2 Drawing Sheets

DRIVER CIRCUIT FOR DRIVING A SWITCHING TRANSISTOR

FIELD OF THE INVENTION

This invention is based on a driver circuit for driving a switching transistor. Such a circuit may be used within the output stage of a line deflection circuit within a television receiver or within a switch mode power supply unit (SMPS) generally used for converting the mains voltage into several dc-operating voltages with different amplitudes and polarities for feeding different stages within a device like a television receiver or a video cassette recorder.

BACKGROUND OF THE INVENTION

Switching transistors used for this purpose must be driven with a defined current in order to keep the power demand and the losses of the driver stage low. Moreover, the switching transistor ought not to be operated at saturation since it then impairs the switching behaviour of the switching transistor as a result of high recombination times of electrons and electrons-holes in the transistor. Furthermore, the switching transistor ought, in each case in the shortest possible time, both to be turned off and to be turned on into a volume resistance which is as small as possible, in order to minimize the losses in the switching transistor. These partly conflicting requirements should be fulfilled as optimally as possible by a circuit for driving a switching transistor.

PCT document WO 99/39435 discloses a circuit intended for the purpose of avoiding undesired saturation of the switching transistor. Said circuit comprises a comparator circuit, which monitors the voltage across the current input of the switching transistor for the purpose of monitoring saturation by comparing said voltage with a reference voltage, thereby effecting regulation. The comparator circuit may be realized, e.g. by a simple transistor circuit, the reference voltage being applied to the control input of said transistor circuit, the current input of said transistor circuit being added to the drive signal of the driver stage, and the current output of said transistor circuit being connected to the voltage via the current input of the switching transistor.

Document "Technology and Service" of SGS entitled "Power Supply Application Manual", July 1985, pages 217–221 discloses a circuit including a switching transistor of the type wherein a MOS-transistor is connected in series with the collector/emitter path of the switching transistor, so that the main current of the switching transistor flows via the series connection of the switching transistor and the MOS transistor. A switching voltage is fed to the gate electrode of said MOS transistor in order to periodically switch on and off the switching transistor and the MOS transistor synchronously. The advantage of said MOS-solution is that the emitter current being suddenly stopped and the current in the collector keeps on flowing through the base of the switching transistor until switch-off. This switch off characteristic is independent and no more function of the driver circuit providing said switching voltage. A negative source at the base is also no more necessary; the closed emitter assures the reverse voltage condition.

Within such a circuit there are special requirements to the switching voltage fed to the gate electrode of the MOS transistor. First said switching voltage must have a defined amplitude for properly switching on and switching off said MOS transistor. Secondly the source providing said switching voltage must have relatively low impedance. This is due to the fact that the MOS transistor has a relative high internal capacity at its gate electrode, which might unduly affect the shape of the switching voltage if the impedance of the source providing the switching voltage is too high.

According to prior art the switching voltage for the MOS transistor is provided by a dedicated integrated circuit yielding at one pin the switching voltage for the MOS transistor with the appropriate amplitude and low impedance of the voltage source for said switching voltage. That means a special circuit is needed for providing said switching voltage.

SUMMARY OF THE INVENTION

According to the invention, the switching voltage for driving the MOS transistor is derived also from an output of said driver circuit, advantageously from the primary winding of a driver transformer applying a switching voltage to the base electrode of the switching transistor.

The invention bases on the recognition or the finding that the switching voltage already available at the driver transformer, particularly at its primary winding, is quite suitable for being used as switching voltage for said MOS transistor both with respect to its amplitude and with respect to the desired low impedance of the voltage source providing said switching voltage. The outlay or the hardware is substantially simplified as compared with to known circuits as the driver transformer is already present within the circuit for driving the switching transistor. That means a dedicated integrated circuit or a special circuitry for generating the switching voltage for the MOS transistor are no more needed.

Preferably the switching voltage for the MOS transistor is derived from the primary winding of the driver transformer. Alternatively the switching voltage may be derived from the secondary winding or from an auxiliary winding or from a tap of one of the windings of the driver transformer. But it is also possible, to use an output of the output stage, which drives the driver transformer.

Advantageously, a terminal of a winding of the driver transformer is directly wired to the gate electrode of the MOS transistor without using additional circuit elements. Preferably the MOS transistor is a so-called Low Voltage Power-MOS-Transistor.

The series circuit of the switching transistor and the MOS transistor may be implemented for example within a line deflection output stage for a television receiver or within a switch mode power supply unit (SMPS) for a television receiver or any other similar devices like a VCR etc.

According to a further embodiment of the invention, a Shottky diode is shunted in parallel to the MOS transistor in opposite direction to the main current flowing through the switching transistor and the MOS transistor. By said diode the losses occurring at the beginning of trace when the current is negative can be reduced. Said diode shorts the internal MOS diode reducing so the overall losses and particularly those within the MOS transistor.

Preferably the primary winding of the driver transformer is connected to the output of an output stage of the driver circuit, whose input is connected to a source of a synchronizing pulse for the switching operation of the switching transistor and the MOS transistor. The driver circuit converts the amplitude, the shape and the duration of the synchronizing pulse into the desired voltage needed for driving the switching transistor and the MOS transistor. Within such a circuit a control signal indicating the value of the actual beam current of a cathode ray tube controlled by the switching transistor is connected to a further input of the driver circuit. Furthermore an East West pincushion correction signal for the cathode ray tube is connected to a further input of the driver circuit. By this circuit the undesired influence of the varying deflection amplitude due to East West correction and of the varying value of the beam current depending on the actual brightness of the reproduced picture and on the value of a current through the switching transistor can be compensated.

BRIEF DESCRIPTION OF THE DRAWINGS

For a better understanding of the invention, preferred embodiments of the invention will be described with reference to the accompanying schematic drawings. In the drawings.

DETAILED DESCRIPTION OF PREFERRED EMBODIMENTS

Figure 1:
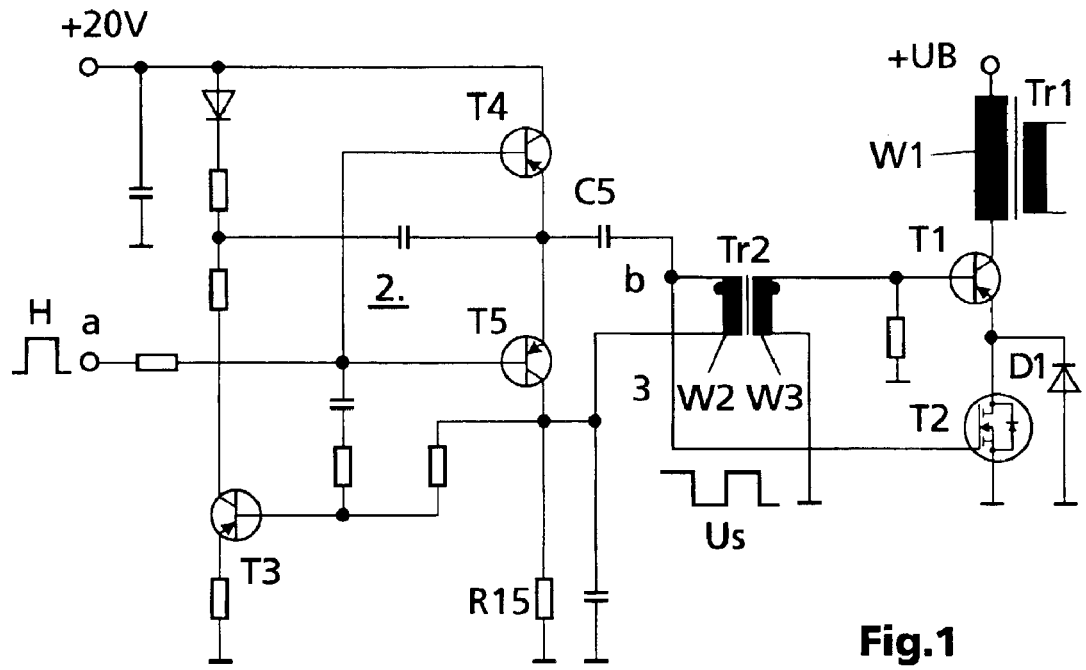
FIG. 1 shows a circuit diagram of a line deflection output stage for a television receiver incorporating the present invention.

FIG. 1 shows a driver circuit comprising an output stage 2 and a driver transformer Tr2 for driving a bipolar switching transistor T1, which is arranged within the output stage of a line deflection circuit of a television receiver. The collector of transistor T1 is connected via the primary winding W1 of a transformer Tr1 to an operating voltage+ UB whereas its emitter is connected to ground via a MOS transistor T2 shunted by a Shottky diode D1. Transistor T1 is periodically turned on and off by a switching voltage supplied via the driver transformer Tr2 to the base of transistor T1. Said switching voltage is derived from a line frequency pulse H supplied to an input terminal a of the driver circuit, which converts the line frequency pulse H to the switching voltage for transistor T1 with the desired amplitude and low impedance of the voltage source. The output stage 2 operates in a modified push-pull configuration with transistors T4 and T5 and its output is coupled via a capacitor C5 to the primary winding W2 of transformer Tr2.

Transistor T5 is alternatingly in a saturated or opened condition whereas transistors T4 and T3 operate in a linear operating mode. Current flowing through transistor T4 is regulated via a feedback path. For this purpose current is measured by current sensing resistor R15 within the collector path of transistor T5. The voltage derived from resistor R15 is fed back to the base of transistor T3 for regulating current within transistor T4.

MOS transistor T2 also operates as a switch being alternatingly switched off and on in synchronism with the bipolar switching transistor T1. The switching voltage Us for MOS transistor T2 is derived from the primary winding W2 of transformer Tr2 by directly connecting terminal b of primary winding W2 by a lead 3 to the gate electrode of MOS transistor T2.

The output stage 2 of the driver circuit operates with a DC supply voltage of 20V. This voltage is too high for the gate of the MOS transistor T2 and cannot be used directly for switching-through of the transistor T2. But the switching voltage Us available at the terminal b of the primary winding W2 of transformer Tr2 has the correct amplitude and a sufficient low impedance of the corresponding voltage source for the desired switching operation of MOS transistor T2.

Diode D1, preferably a Shottky diode, which is provided in parallel to MOS transistor T2 for reducing the losses occurring at the beginning of the trace period where the current through transistors T1 and T2 is negative. The diode D1 shorts the internal MOS-diode of MOS transistor T2 reducing so the overall losses and particularly those in the MOS transistor T2.

Figure 2:
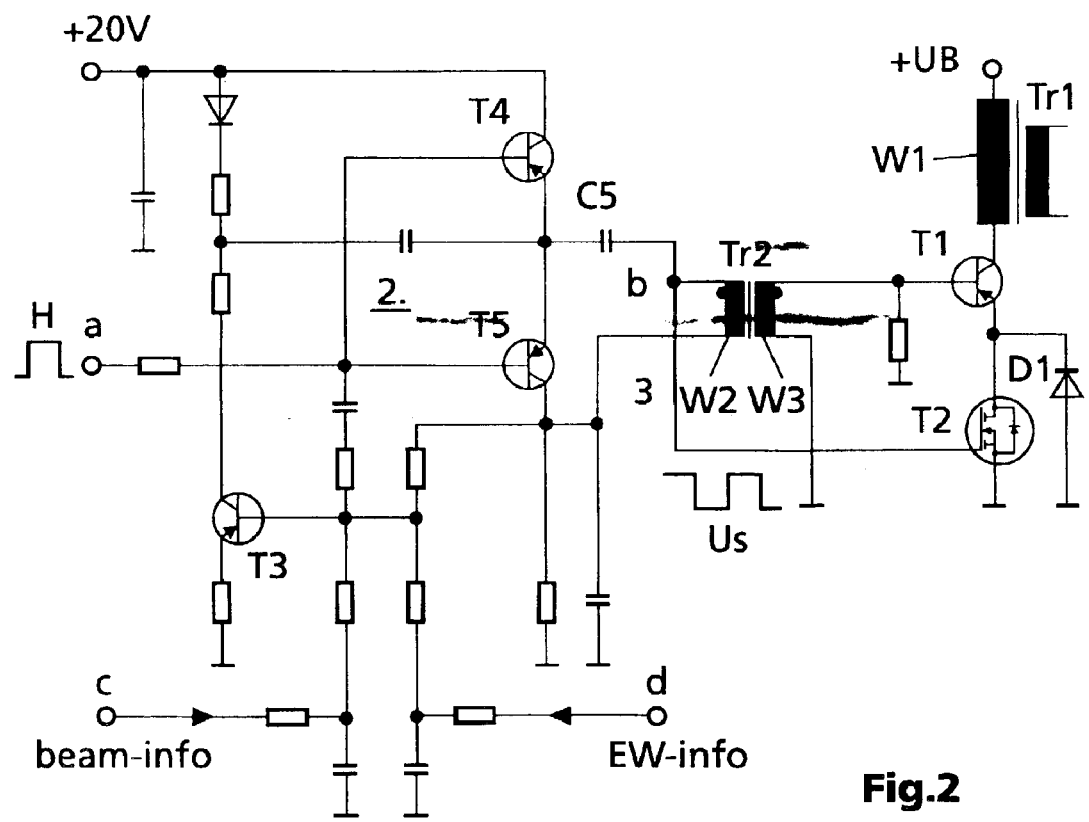
FIG. 2 shows a modified version of the circuit shown in FIG. 1, having inputs for picture correction.

FIG. 2 essentially shows the circuit diagram of FIG. 1. Additionally to FIG. 1 a signal "beam-info" indicating the average value of the beam current within the cathode ray tube is fed via a further input terminal c to driver circuit 2. Furthermore a signal "EW-info" is supplied via a further input terminal d to the driver circuit 2. Within operation of the television receiver both the varying value of the beam current and the current amplitude of EW-correction undesirably affect the current drawn by switching transistor T1. By additionally feeding said two signals "beam-info" and "EW-info" to the driver circuit said undesired influence on the current through switching transistor T1 can be reduced or eliminated.

Figure 3:
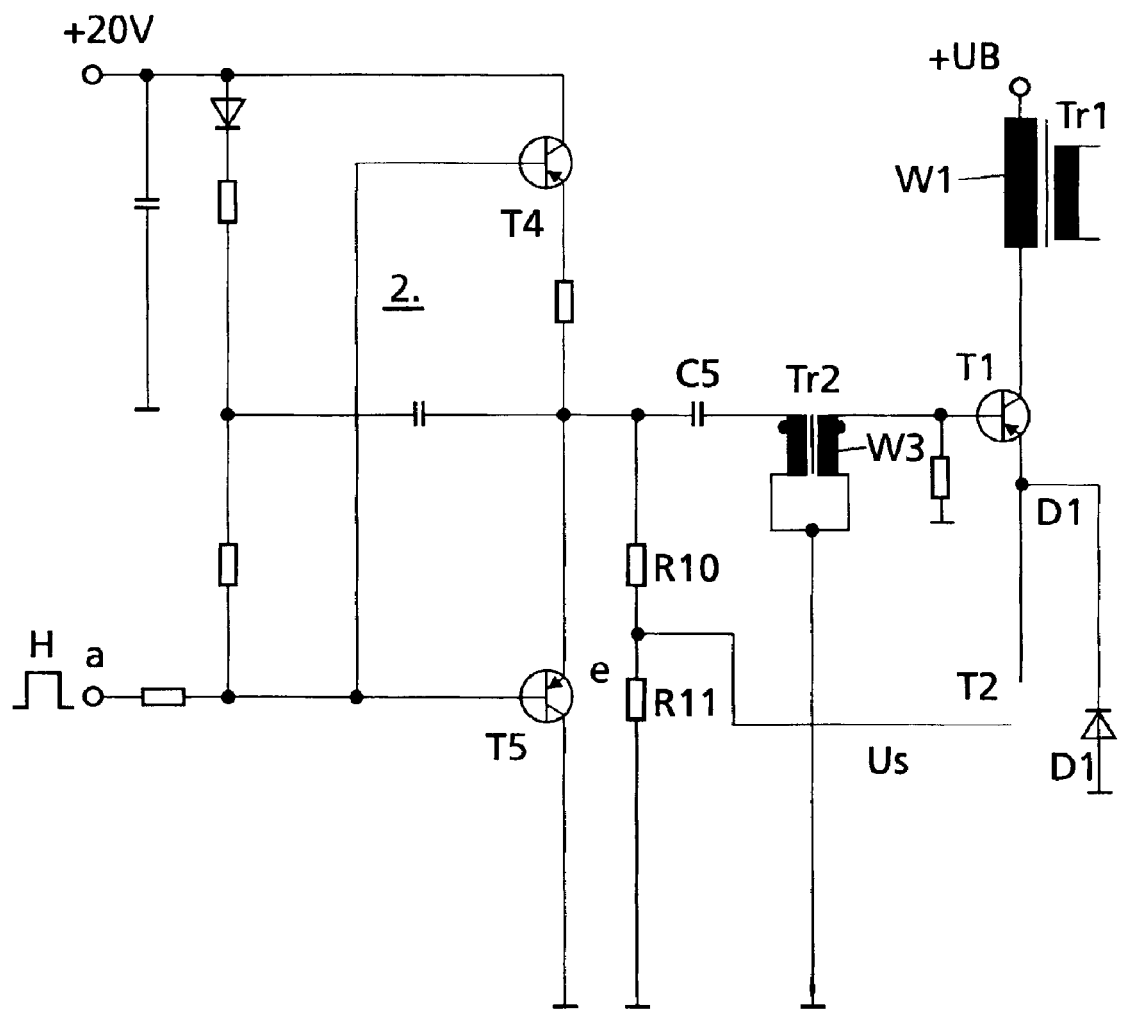
FIG. 3 shows a simplified version of the circuit shown in FIG. 1.

FIG. 3 shows a simplified version of the circuit shown in FIG. 1 working according to the same principle. Therein, in contrary to FIGS. 1 and 2, both primary winding W2 and secondary winding W3 of driver transformer Tr2 are connected to ground. Also, the switching voltage Us for the MOS transistor T2 is derived in this embodiment via a voltage divider with resistors R10 and R11 from the output of the output stage 2, ahead of capacitor C5. This guarantees also, that the voltage Us is not too high for the gate of the MOS transistor T2.

What is claimed is:

1. Driver circuit for driving a switching transistor and a MOS-transistor, both transistors being connected in series with a primary winding of a transformer and said MOS-transistor being arranged between said switching transistor and ground, and a switching voltage being applied to a gate electrode of said MOS-transistor, said driver circuit comprising a driver transformer for driving said switching transistor and an output stage for driving said driver transformer, said switching voltage being derived also from an output of said driver circuit, and said MOS transistor being a Low Voltage POWER MOS-transistor and said switching transistor being a power switching transistor of a line deflection output stage of a television receiver or of a switch mode power supply circuit.

2. Circuit according to claim 1, wherein said switching voltage is derived from a primary winding of said driver transformer.

3. Circuit according to claim 1, wherein said switching voltage is derived from a secondary winding of said driver transformer or from an auxiliary winding of said driver transformer.

4. Circuit according to claim 2, wherein said switching voltage is derived from a tap of a winding of said driver transformer.

5. Circuit according to claim 1, wherein said switching voltage is derived via a voltage divider from an output of said output stage.

6. Circuit according to claim 1, wherein a primary winding of said driver transformer is coupled to an output of said output stage, whose input is connected to a source of a synchronizing pulse for the switching operation of said switching transistor and said MOS-transistor, and said output stage being a push pull transistor output stage.

7. Circuit according to claim 1, a Shottky diode is shunted in parallel to said MOS-transistor in opposite direction to the main current flowing through said switching transistor and said MOS-transistor.

* * * * *